United States Patent [19]
Gilliam et al.

[11] Patent Number: 5,699,601
[45] Date of Patent: Dec. 23, 1997

[54] SNAP TAB FASTENER AND DISASSEMBLY TOOL THEREFOR

[75] Inventors: Peter H. Gilliam, Novi; David William Lumley, Livonia, both of Mich.

[73] Assignee: Ford Motor Company, Dearborn, Mich.

[21] Appl. No.: 521,506

[22] Filed: Aug. 30, 1995

[51] Int. Cl.$^6$ .................................................. B25B 27/14
[52] U.S. Cl. ........................ 29/278; 29/270; 403/329; 403/335; 403/364
[58] Field of Search ........................ 403/13, 14, 329, 403/330, 288, 375, 364; 254/20, 21, 25; 29/244, 270, 278, 283.5

[56] References Cited

U.S. PATENT DOCUMENTS

| | | | |
|---|---|---|---|
| 4,004,734 | 1/1977 | Hadtke | 239/58 |
| 4,078,602 | 3/1978 | Richer | 165/32 |
| 4,168,095 | 9/1979 | Temino et al. | 296/70 |
| 4,212,415 | 7/1980 | Neely | 222/231 |
| 4,523,633 | 6/1985 | Furukawa et al. | 165/76 |
| 4,535,197 | 8/1985 | Butler | 174/41 |
| 4,635,809 | 1/1987 | Bachman et al. | 220/4 B |
| 4,706,808 | 11/1987 | Guetersloh | 206/305 |
| 4,944,072 | 7/1990 | Robson | 24/587 |
| 5,257,904 | 11/1993 | Sullivan | 415/214.1 |

FOREIGN PATENT DOCUMENTS

| | | |
|---|---|---|
| 0 409 347 A1 | 1/1991 | European Pat. Off. . |
| 2 507 707 | 12/1982 | France . |
| 2 699 614 | 6/1994 | France . |
| 33 46 243 A1 | 7/1985 | Germany . |
| 89 10 424.2 | 8/1990 | Germany . |
| 92 09 557.7 | 10/1992 | Germany . |
| 94 10 210.4 | 10/1994 | Germany . |
| 58-214729 | 12/1983 | Japan . |
| 5-133563 | 5/1993 | Japan . |
| 385 461 | 3/1965 | Switzerland . |

*Primary Examiner*—Robert C. Watson
*Attorney, Agent, or Firm*—Roger L. May; Raymond Coppiellie

[57] ABSTRACT

A snap tab fastener connects first and second ventilation system housing members together. The fastener includes a tongue and groove assembly and a tab and loop assembly. The tongue and groove have a bit of flexibility so that an air tight connection is maintained during minor separation of the two. The tab engages the loop to lock the two components together.

15 Claims, 3 Drawing Sheets

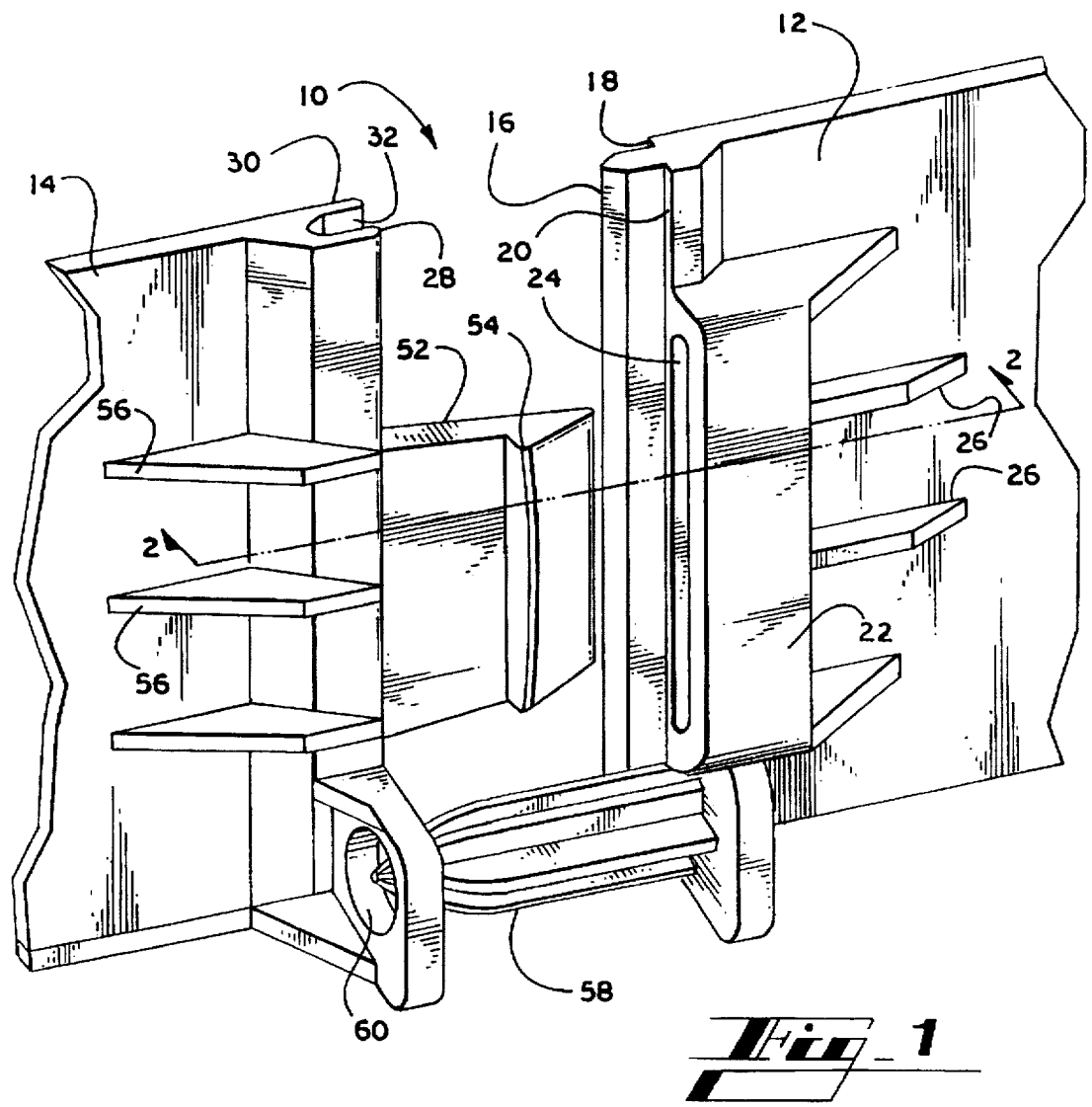
Fig_1
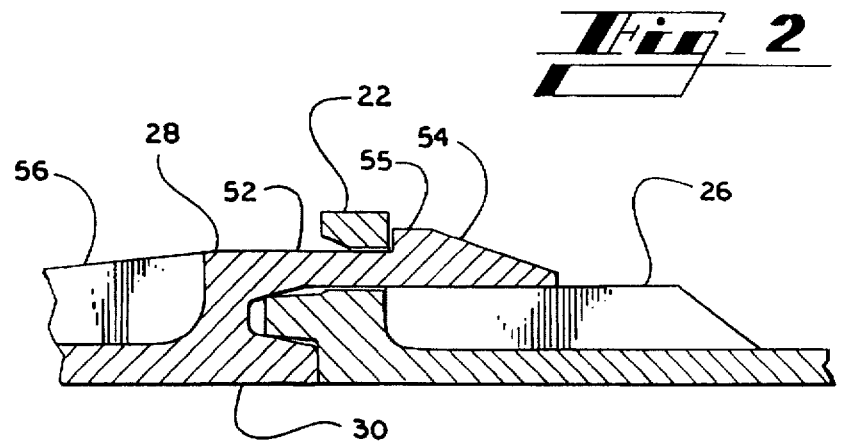
Fig_2

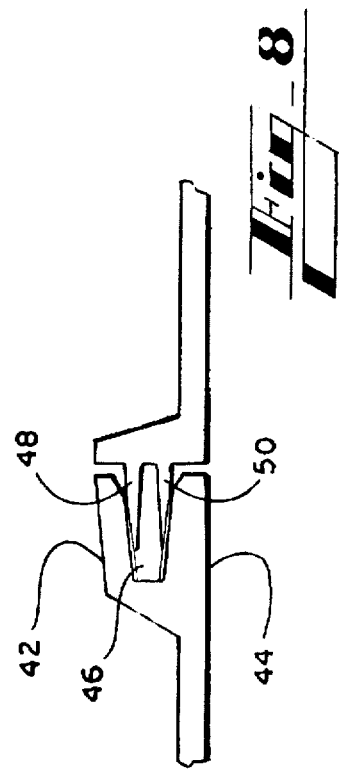
*Fig_6*
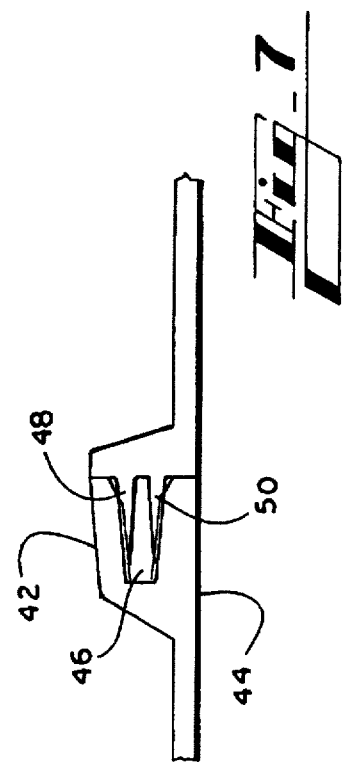
*Fig_7*
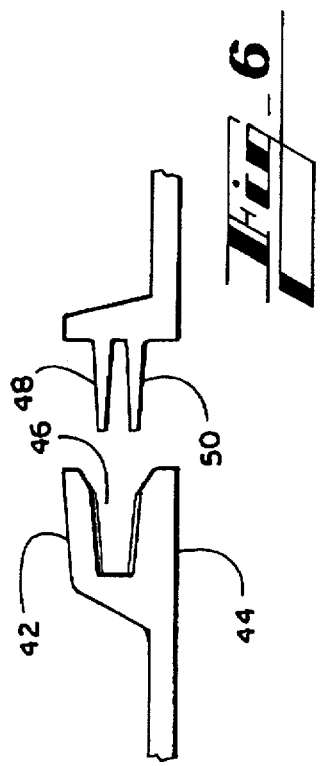
*Fig_8*
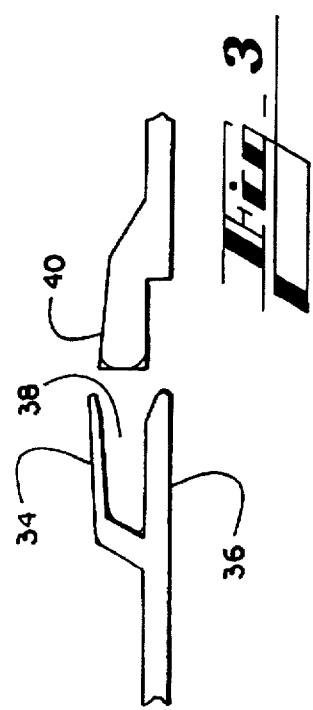
*Fig_3*
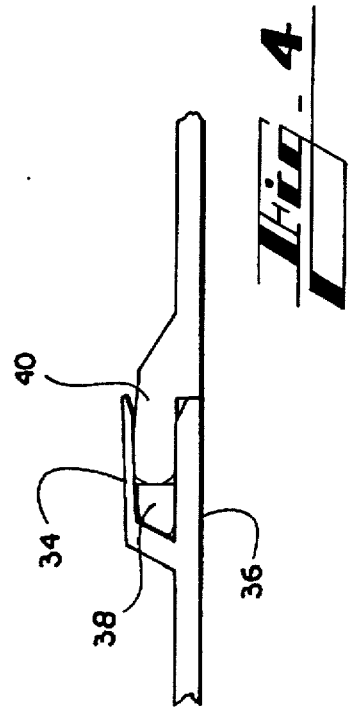
*Fig_4*
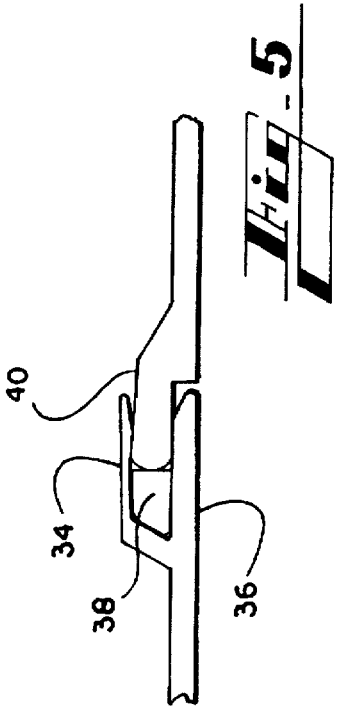
*Fig_5*

5,699,601

SNAP TAB FASTENER AND DISASSEMBLY TOOL THEREFOR

FIELD OF THE INVENTION

The present invention relates generally to fasteners, and, more particularly, to a tongue and groove fastener for connecting two plastic components.

BACKGROUND OF THE INVENTION

In automobile manufacturing two plastic housing components are often connected to produce a complete housing. A variety of fasteners can be used but tongue and groove fasteners are simple and effectively connect the two components. Unfortunately, in applications such as ventilation systems where an air tight connection is desired, conventional tongue and groove assemblies are ineffective because the tongue and groove connection leaks as the housing members separate. Separation on the order of 3 mm is common and causes the housing to leak at the joint. A tab fastener is another simple and effective fastener, but is also ineffective where an air tight connection is desired. Accordingly, it will be appreciated that it would be highly desirable to have a simple, effective fastener for connecting two plastic components where an air tight connection is desired.

SUMMARY OF THE INVENTION

The present invention is directed to overcoming one or more of the problems set forth above. Briefly summarized, according to one aspect of the present invention, a snap tab fastener for connecting first and second housing members together comprises a tongue extending from an end portion of the first housing member defining a first space below the tongue and a second space above the tongue, a loop on the end portion of the first housing member above the tongue having an opening in communication with the second space, a first groove member extending from the second housing member, a second groove member extending from the second housing member defining a groove between the first and second groove members for receiving the tongue, and a tab extending from the second groove member in a direction toward the tongue and engageable with the loop to lock the first and second housing members together.

The tab snaps into a locked position producing a snapping sound to give an audible indication that the components are locked together. An air tight tongue and groove connection is maintained during expected component separation by bifurcating the tongue and compressing the bifurcated tongue in the groove. Another air tight tongue and groove connection is made by biasing the sides of the grooves toward one another. The tongue spreads the sides of the groove apart as it enters but the sides exert sealing contact to maintain an air tight seal.

These and other aspects, objects, features and advantages of the present invention will be more clearly understood and appreciated from a review of the following detailed description of the preferred embodiments and appended claims, and by reference to the accompanying drawings.

BRIEF DESCRIPTION OF THE DRAWINGS

FIG. 1 is a perspective view of a preferred embodiment of two plastic housing components connected together with snap tab fastener according to the present invention.

FIG. 2 is a longitudinal sectional view, taken along line 2—2 of FIG. 1, of the housing components of FIG. 1 illustrated after assembly.

FIG. 3 is a sectional view of a tongue and groove portion of a snap tab fastener similar to FIG. 2, but illustrating another preferred embodiment before assembly.

FIG. 4 illustrates the tongue and groove of FIG. 3 assembled.

FIG. 5 illustrates the tongue and groove of FIG. 4 assembled but with expected minor separation.

FIG. 6 is a sectional view of a tongue and groove portion of a snap tab fastener similar to FIG. 2, but illustrating another preferred embodiment before assembly.

FIG. 7 illustrates the tongue and groove of FIG. 6 assembled.

FIG. 8 illustrates the tongue and groove of FIG. 7 assembled but with expected minor separation.

DETAILED DESCRIPTION OF THE PREFERRED EMBODIMENTS

Figure 9:
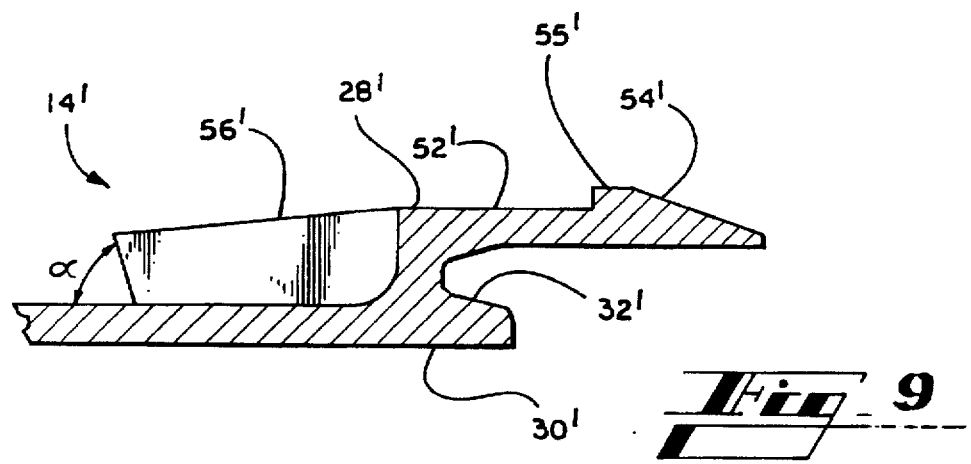
FIG. 9 is a sectional view similar to FIG. 2, but illustrating another preferred embodiment.

Referring to FIGS. 1–2, a snap tab fastener 10 connects first and second housing members 12, 14, such as housing members of an automobile ventilation system. The first housing member 12 has an end portion with a tongue 16 extending from the end portion and defining a first space 18 below the tongue and a second space above 20 the tongue. A loop 22 is also positioned on the end portion of the first housing member 12 above the tongue 16. The loop 22 has an opening 24 in communication with the second space 20 so that the loop opens into the second space. Positioned near the loop 22 are longitudinally extending reinforcing ribs 26. As illustrated, the ribs 26 extend longitudinally and are placed perpendicular to the loop 22 which extends transversely across the first housing member 12. The end portions of the loop 22 that are attached to the first housing member may be configured as reinforcing ribs also.

The second housing member 14 contains first and second groove members 28, 30 that are spaced from one another. The groove members 28, 30 extend from the second housing member and define a groove 32 between them for receiving the tongue 16 that extends from the first housing member 12.

FIGS. 3–5 illustrate an embodiment of a tongue and groove joint wherein first and second groove members 34, 36 have flat surfaces defining groove 38. The second groove member 36 angles towards the first groove member 34 making the open end of the groove 38 narrower than the closed bottom and so that the second groove member is biased toward the first groove member. Upon assembly, an air tight seal is effected between the tongue 40 and groove members 34, 36 by forcing the tongue into the groove thereby separating the groove members whose inward bias presses the groove members against the tongue in sealing engagement. Because groove members 34, 36 are biased towards one another exerting a sealing force on the tongue, the air tight seal remains in tact during the expected separation of the tongue 40 and groove members 34, 36 in the longitudinal direction. To facilitate assembly, the mouth of the groove is chamfered or otherwise relieved making it larger for easier access by the tongue which may also have a chamfered or radiused edge.

Referring to FIGS. 6–8, another embodiment of a tongue and groove joint has first and second groove members 42, 44 that define a groove 46 that receives first and second tongue members 48, 50. The tongue is bifurcated with the first and second tongue members 48, 50 being spaced apart a preselected distance. Upon assembly, the first and second tongue members 48, 50 are squeezed towards one another reducing the space separating them. This compression of the tongue members effects an air tight seal with the first tongue member 48 in sealing contact with the first groove member 42 and the second tongue member 50 in sealing contact with the second groove member 44. The sealing contact remains during the expected separation.

Again referring to FIGS. 1–2, a tab 52 extends from the second groove member 30 in a direction toward the tongue 16 and engages the loop 22 to lock the first and second housing members 12, 14 together. The tab 52 has a locking member 54 that is forced through the loop opening stretching the loop thereby causing the loop to snap back to its original shape once the locking member has passed through the loop opening. The loop 22 flexes to accept the locking member 54 of the tab 52 a portion 55 of which is curved slightly to ensure even expansion of the loop 22 from the center outward during insertion of the locking member 54. The curved portion 55 is curved upward slightly from the horizontal but is flat otherwise and is referred to as a curved flat because it is flat compared to the distal end of the locking member which contains a ramp or is tapered. Loop 22 is preferably about 10 mm wider than the locking member and behaves as a bow to snap onto the locking member. The inside of the loop is radiused at the connections to the end portion of the first housing member 12 to prevent cracking. Wear of the locking member 54 of the tab 52 during insertion is minimized by the curved flat 55 which also increases the holding power of the tab. Also, the thickness of the tab between the curved flat 55 and groove 32 is preferably slightly greater than the gap in the loop to accommodate insertion strain on the loop during assembly. Such a forced fit ensures permanent retention. A number of longitudinally extending ribs 56 are located on the second housing member behind the first groove member and may be attached to the first groove member. A locator pin 58 is positioned on one of the housing members and engages a locator loop 60 in the other housing member to facilitate alignment of the housing members.

FIG. 9 illustrates another embodiment of a second housing member 14' containing first and second groove members 28', 30' defining groove 32' and containing tab 52' with locking member 54' and curved flat 55'. The second housing member 14' also contains reinforcing rib 56' angularly oriented so that one end forms an angle, α, with the housing member 14'. Making α an acute angle facilitates machine assembly of the housing members. Where machine assembly is not desired, α may be any convenient value.

Figure 10:
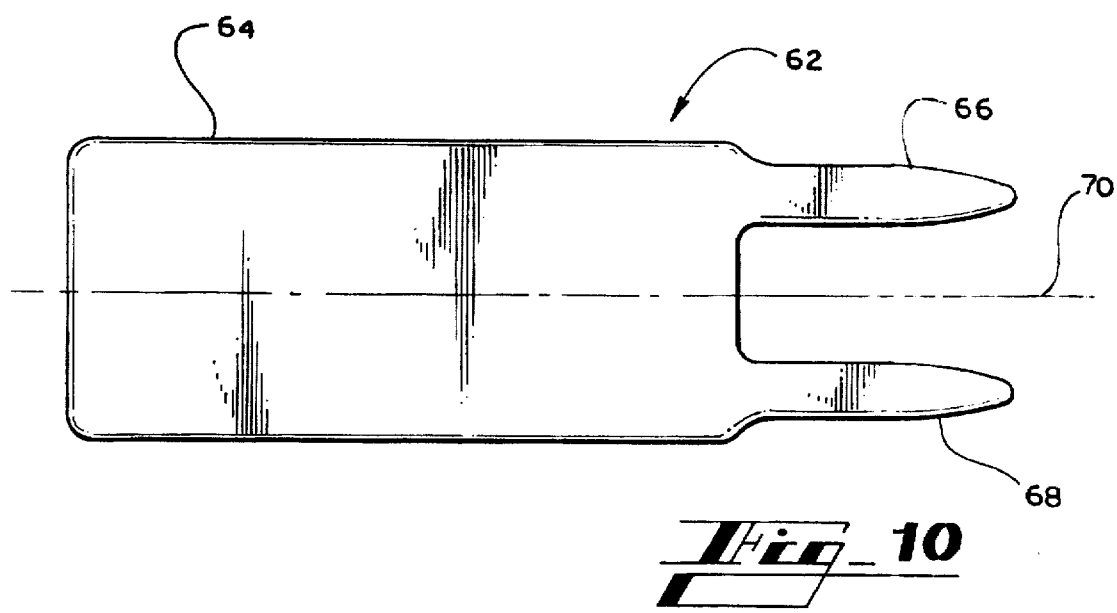
FIG. 10 is a plan view of a hand tool for disassembling the plastic housing members of FIG. 1.
Figure 11:
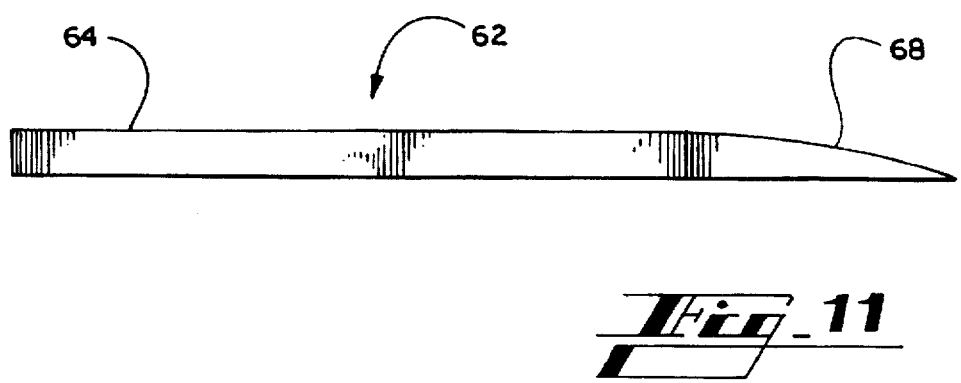
FIG. 11 is a side view of the hand tool of FIG. 10.

FIGS. 10 and 11 illustrate a hand tool 62 for disassembling the housing members 12, 14. The tool 62 is preferably constructed of metal or other strong, durable material and has a handle portion 64 to be held in the hand of a worker. Extending from the handle 64 are first and second spaced apart fingers 66, 68 which can straddle a reinforcing rib 26 as the tool is inserted between the loop 22 and tab 52'. Preferably, the handle 64 is sized to fit a worker's hand with the outside edges of the fingers tapering inward toward one another or being offset from the outside edges of the handle toward a central longitudinal axis 70 to manipulate the tab 52. The tool is generally flat with the tips of the fingers rounded or tapered as viewed from the top in FIG. 10. FIG. 11 shows the tapered profile of the fingers which facilitate insertion between the loop and tab.

Operation of the present invention is believed to be apparent from the foregoing description and drawings, but a few words will be added for emphasis. The housing members are assembled by aligning the locator pin with its mating locator loop and pushing the members toward one another. As the tongue enters the groove, the tab enters the locking loop. When the tab snaps into position, the tongue is seated in the groove forming an air tight seal. After the loop snaps over the tab, the housing members may separate a small amount, but the tongue maintains sealing engagement in the groove. Disassembly is accomplished by inserting the disassembly hand tool between the tab and loop to disengage the tab and loop. Pressing down on the tab with the tool disengages the tab and loop. The housing members can be pulled apart while the tab and loop are disengaged.

It can now be appreciated that there has been presented a snap tab fastener that connects first and second ventilation system housing members together. The fastener includes a tongue and groove assembly and a tab and loop assembly. The tongue and groove have a bit of flexibility so that an air tight connection is maintained during minor separation of the two housing members. The tab engages the loop to lock the two housing members together.

While the invention has been described with particular reference to an automobile ventilation system, it is apparent that the snap tab fastener is easily adapted to other housings. As is evident from the foregoing description, certain aspects of the invention are not limited to the particular details of the examples illustrated, and it is therefore contemplated that other modifications and applications will occur to those skilled in the art. It is accordingly intended that the claims shall cover all such modifications and applications as do not depart from the true spirit and scope of the invention.

What is claimed is:

1. A snap tab fastener for connecting first and second housing members together, comprising:

a tongue extending from an end portion of said first housing member defining a first space below said tongue and a second space above said tongue;

a loop on the end portion of said first housing member above said tongue having an opening in communication with said second space, said loop having a central portion and a center;

a first groove member extending from said second housing member;

a second groove member, spaced from said first groove member, extending from said second housing member defining a groove between said first and second groove members for receiving said tongue; and a tab extending from said second groove member in a direction toward said tongue and engageable with said loop to lock said first and second housing members together, said tab having a locking member that protrudes through said loop, said loop snapping into position over said tab locking said housing members together, said locking member having a horizontally extending raised curved portion that curves vertically upward to contact said central portion of said loop to expand said loop from said center horizontally outward during insertion of said locking member in said loop.

2. A snap tab fastener, as set forth in claim 1, wherein said tongue is bifurcated.

3. A snap tab fastener, as set forth in claim 1, wherein said tongue has first and second flanges, said first flange enjoying sealing engagement with said first groove member and said second flange enjoying sealing engagement with said second groove member.

4. A snap tab fastener, as set forth in claim 1, wherein said tongue has first and second flanges spaced from one another a first preselected distance, said flanges contacting said groove members and compressing towards one another so that they are spaced from one another a second preselected distance that is less than said first preselected distance, said first flange exerting a first sealing force against said first groove member and said second flange exerting a second sealing force against said second groove member.

5. A snap tab fastener, as set forth in claim 1, wherein said first and second groove members are biased towards one another.

6. A snap tab fastener, as set forth in claim 1, wherein said groove members converge towards one another at an open mouth of said groove.

7. A snap tab fastener, as set forth in claim 1, including longitudinally extending reinforcing ribs on said first housing member near said loop.

8. A snap tab fastener, as set forth in claim 1, including longitudinally extending reinforcing ribs on said second housing member near said tab.

9. A snap tab fastener, as set forth in claim 8, wherein each of said ribs has an end forming an acute angle with said second housing member.

10. A snap tab fastener, as set forth in claim 1, including an alignment pin on one of said first and second housing members alignable with a locator loop on the other of said first and second housing members.

11. A snap tab fastener, as set forth in claim 1, wherein said loop is about 10 mm wider than said tab to act as a bow to snap onto said locking member during insertion of said tab in said loop.

12. A snap tab fastener, as set forth in claim 1, wherein said loop defines a gap of predetermined thickness and wherein a thickness of said tab between said groove and a raised curved portion of said tab is greater than said thickness of said gap.

13. A snap tab fastener, as set forth in claim 1, including a disassembly tool having a handle with first and second spaced apart, tapered fingers extending from said handle for insertion between said loop and tab to unlock said first and second housing members.

14. A snap tab fastener for connecting first and second housing members together, comprising:

a tongue extending from an end portion of said first housing member defining a first space below said tongue and a second space above said tongue;

a loop on the end portion of said first housing member above said tongue having a central portion with a center and an opening in communication with said second space;

a first groove member extending from said second housing member;

a second groove member, spaced from said first groove member, extending from said second housing member defining a groove between said first and second groove members for receiving said tongue, said tongue and groove members enjoying sealing engagement during minor separation of said first and second housing members; and a tab having a locking member and extending from said second groove member in a direction toward said tongue, said locking member having a horizontally extending raised curved portion that curves vertically upward to contact said central portion of said loop to expand said loop from said center horizontally outward during insertion of said locking member into said loop, said locking member protruding through said loop when said first and second housing members are assembled to lock said first and second housing members together when said loop snaps into position over said locking member.

15. A snap tab fastener for connecting first and second housing members together, comprising:

a tongue extending from an end portion of said first housing member defining a first space below said tongue and a second space above said tongue;

a loop on the end portion of said first housing member above said tongue having a central portion with a center and an opening in communication with said second space;

longitudinally extending reinforcing ribs on said first housing member near said loop;

a first groove member extending from said second housing member;

a second groove member, spaced from said first groove member, extending from said second housing member defining a groove between said first and second groove members for receiving said tongue, said tongue and groove members enjoying sealing engagement during minor separation of said first and second housing members;

a tab having a locking member and extending from said second groove member in a direction toward said tongue, said locking member having a horizontally extending raised curved portion that curves vertically upward to contact said central portion of said loop to expand said loop from said center horizontally outward during insertion of said locking member into said loop, said locking member protruding through said loop when said first and second housing members are assembled to lock said first and second housing members together when said loop snaps into position over said locking member;

longitudinally extending reinforcing ribs on said second housing member near said tab; and an alignment pin on one of said first and second housing members alignable with a locator loop on the other of said first and second housing members.

* * * * *